(12) United States Patent
Tani

(10) Patent No.: US 7,211,876 B2
(45) Date of Patent: May 1, 2007

(54) SEMICONDUCTOR DEVICE UTILIZING MULTIPLE CAPACITORS EACH HAVING AN INSULATING LAYER HAVING A DIFFERENT THICKNESS

(75) Inventor: Kouichi Tani, Tokyo (JP)

(73) Assignee: Oki Electric Industry, Co., Ltd., Tokyo (JP)

( * ) Notice: Subject to any disclaimer, the term of this patent is extended or adjusted under 35 U.S.C. 154(b) by 58 days.

(21) Appl. No.: 11/075,688

(22) Filed: Mar. 10, 2005

(65) Prior Publication Data

US 2006/0001125 A1 Jan. 5, 2006

(30) Foreign Application Priority Data

Jul. 1, 2004 (JP) .............................. 2004-195484

(51) Int. Cl.
*H01L 29/00* (2006.01)
*H01L 21/338* (2006.01)

(52) U.S. Cl. ............... 257/532; 257/594; 257/E27.048; 438/171; 438/239

(58) Field of Classification Search ..................... None
See application file for complete search history.

(56) References Cited

U.S. PATENT DOCUMENTS

| 5,691,223 | A  | * | 11/1997 | Pittikoun et al. | ............ | 438/253 |
| 6,410,955 | B1 | * | 6/2002  | Baker et al.     | ................. | 257/307 |
| 6,509,245 | B2 | * | 1/2003  | Baker et al.     | ................. | 438/396 |
| 6,677,637 | B2 | * | 1/2004  | Bernstein et al. | ............ | 257/307 |
| 6,913,966 | B2 | * | 7/2005  | Baker et al.     | ................. | 438/240 |

FOREIGN PATENT DOCUMENTS

| JP | 2002-261298 | 9/2002 |
| JP | 2002-353469 | 12/2002 |

\* cited by examiner

*Primary Examiner*—Alonzo Chambliss
(74) *Attorney, Agent, or Firm*—Takeuchi & Kubotera LLP

(57) ABSTRACT

A semiconductor device includes a first transistor having a first gate oxide layer with a first thickness; a second transistor having a second gate oxide layer with a second thickness different from the first thickness; and at least one of a capacitor and a variable capacitance diode. One of the capacitor and the variable capacitance diode includes a first electrode having a first area and a second area; a second electrode formed in the first area with the first gate oxide layer in between; and a third electrode formed in the second area with the second gate oxide layer in between. The second electrode and third electrode have comb shapes nested inside one another.

5 Claims, 3 Drawing Sheets

SEMICONDUCTOR DEVICE UTILIZING MULTIPLE CAPACITORS EACH HAVING AN INSULATING LAYER HAVING A DIFFERENT THICKNESS

BACKGROUND OF THE INVENTION AND RELATED ART STATEMENT

The present invention relates to a semiconductor device and a method of producing the semiconductor device.

A variable capacitance diode is called a varactor in which a capacitance is changed according to a direct current voltage applied between electrodes thereof. The variable capacitance diode is used for controlling a frequency as a circuit element of a voltage control oscillator (VOC) in a phase locked loop (PLL). The variable capacitance diode in a semiconductor integrated circuit is generally produced with a process similar to those of MOS transistors. That is, a source electrode is connected to a drain electrode, and a gate oxide layer formed with a gate electrode in between generates a capacitance as a capacitor.

FIG. 2 is a schematic view showing a general configuration of a semiconductor integrated circuit with the variable capacitance diode. The semiconductor integrated circuit has a plurality of input terminals 1 for receiving external signals including clock signals CLK, and the input terminals 1 are connected to a logic circuit 3 via an input circuit 2. The logic circuit 3 performs a specific logical calculation process according to an external signal applied to the input terminals 1, and is formed of a combination of logic gates formed of several MOD transistors and the like.

The logic circuit 3 has VCO and PLL (not shown) synchronizing the clock signal CLK received from outside, so that an internal clock signal with a frequency different from that of the clock signal CLK is generated. A variable capacitance diode 4 is used in VCO as a capacitor of, for example, an LC resonant circuit formed of a coil and a capacitor. A variable direct current voltage is applied to a control electrode of the variable capacitance diode 4 for controlling an oscillating frequency. A result signal obtained in the login circuit 3 is sent to output terminals 6 via an output circuit 5.

The input circuit 2 protects the logic circuit 3 from a static surge voltage entering through the input terminals 1. The input circuit 2 has a protection diode connected between the input terminals 1, and a power source terminal and a ground terminal (not shown). The input circuit 2 also has a buffer amplifier for sending an input signal to the logic circuit 3. Similarly, the output circuit 5 has a buffer amplifier for protecting the logic circuit 3 from a static surge voltage entering through the output terminals 6.

The buffer amplifiers in the input circuit 2 and the output circuit 5 are formed of transistors with a gate oxide layer having a thickness larger than that of those in the logic circuit 3 for preventing breakdown due to a static surge voltage and the like. For example, a transistor in the logic circuit 3 may have a gate oxide layer with a thickness of 2.5 nm, while a transistor in the input circuit 2 or the output circuit 5 may have a gate oxide layer with a thickness of 5.0 nm. Similar to the transistor in the logic circuit 3, the variable capacitance diode 4 may have a gate oxide layer with a thickness of 2.5 nm. A pattern of the variable capacitance diode 4 is designed to have an area enough for obtaining a necessary capacitance according to a variable range of an oscillating frequency of VCO.

Although a purpose and a structure are different from those of the present invention, Patent Reference 1 discloses a method of producing a semiconductor device. A pair of varactor diodes in a same semiconductor is connected at short sides thereof, so that the semiconductor chip is thermally processed in a laterally elongated state to obtain a same capacitance for the varactor diodes.

Patent Reference 2 discloses a variable capacitance diode device, in which two variable diode elements with different effective areas are formed on a semiconductor substrate having a base substrate and an epitaxial layer. In the variable capacitance diode device, one variable diode element with a small effective area is used in a local oscillation circuit, and the other variable diode element with a large effective area is used in a high frequency circuit. An OSC signal and an RF signal with different levels per stage are overlapped with direct current voltages and applied, respectively. Accordingly, two C-V characteristics approach with each other, thereby reducing a tracking error.

Patent Reference 1: Japanese Patent Publication (Kokai) No. 2002-261298
Patent Reference 2: Japanese Patent Publication (Kokai) No. 2002-353469

In the semiconductor devices described above, when the oscillating frequency of VCO is changed, it is necessary to change an area of the variable capacitance diode 4. Accordingly, even though a circuit configuration is the same, it is necessary to change a circuit pattern according to the oscillating frequency.

In view of the problems described above, an object of the present invention is to provide a semiconductor device in which it is possible to arbitrarily change an oscillating frequency of VCO disposed therein without changing a circuit pattern.

Further objects and advantages of the invention will be apparent from the following description of the invention.

SUMMARY OF THE INVENTION

In order to attain the objects described above, according to a first aspect of the present invention, a semiconductor device includes a semiconductor substrate having a first area, a second area disposed adjacent to the first area, and a third area disposed adjacent to the first area on a side opposite to the second area; a first capacitor having a first insulating layer with a first thickness formed in the first area and a first electrode formed on the first insulating layer and extending from the first area to the second area; a second capacitor having a second insulating layer with a second thickness different from the first thickness formed in the first area in parallel to the first insulating layer with a first gap therefrom, and a second electrode formed on the second insulating layer and extending from the first area to the third area; a third capacitor having a third insulating layer with the first thickness formed in the first area in parallel to the second insulating layer with a second gap therefrom, and a third electrode formed on the third insulating layer and extending from the first area to the second area; a first wiring layer formed in the second area and electrically connected to the first electrode and the third electrode; and a second wiring layer formed in the third area and electrically connected to the second electrode.

According to a second aspect of the present invention, a semiconductor device includes a first transistor having a first gate oxide layer with a first thickness, a second transistor having a second gate oxide layer with a second thickness, and one of a capacitor and a variable capacitance diode. The one of the capacitor and the variable capacitance diode includes a first electrode having a first area and a second area, a second electrode formed in the first area with the first gate oxide layer having the first thickness in between, and a third electrode formed in the second area with the second gate oxide layer having the second thickness in between. The second electrode has a first comb shape, and the third electrode has a second comb shape nested inside one another with the second electrode.

In the present invention, the second electrode is formed in the first area of the first electrode with the first gate oxide layer having the first thickness in between. The third electrode is formed in the second area of the first electrode with the second gate oxide layer having the second thickness in between. The second electrode has the first comb shape, and the third electrode has the second comb shape nested inside one another with the second electrode. Accordingly, it is possible to change a capacitance by changing a mask pattern upon forming the oxide layer or cutting a base portion of a tooth of the comb shape after the electrode is formed without changing a pattern of the capacitor and the variable capacitance diode.

BRIEF DESCRIPTION OF THE DRAWINGS

FIGS. 1(a) and 1(b) are views showing a variable capacitance diode according to an embodiment of the present invention, wherein FIG. 1(a) is a plan view thereof and FIG. 1(b) is a sectional view taken along line 1(b)—1(b) in FIG. 1(a);

DETAILED DESCRIPTION OF PREFERRED EMBODIMENTS

Hereunder, embodiments of the present invention will be explained with reference to the accompanying drawings. In the present invention, ions are implanted into a surface of a semiconductor substrate in rectangle areas arranged in parallel to form a diffusion area, so that a first electrode of a variable capacitance diode is formed in the rectangle areas. A first oxide layer is formed on an entire surface of the diffusion area.

A second electrode and a third electrode are arranged to face the first electrode. An area to be the second electrode is covered with a resist pattern, and the first oxide layer in an area without the resist pattern is removed. After the resist layer is removed, a second oxide layer is formed on an entire surface of the semiconductor substrate. After a conductive layer is formed on the second oxide layer, the conductive layer and the second oxide layer are shaped to form the second and third electrodes with comb shapes nested inside one another. An interlayer insulating layer with a flat surface is formed on the surface of the semiconductor substrate. A contact hole is formed in the interlayer insulating layer for wiring the first, second, and third electrodes. A metal material for wiring is filled in the contact hole, and a metal wiring layer is formed on the surface of the semiconductor substrate. Then, the metal wiring layer is shaped to form a wiring pattern.

The embodiments of the present invention will be explained to clarify the features of the invention. The drawings are used for the explanation, and do not limit the scope of the invention.

Figure 1A:
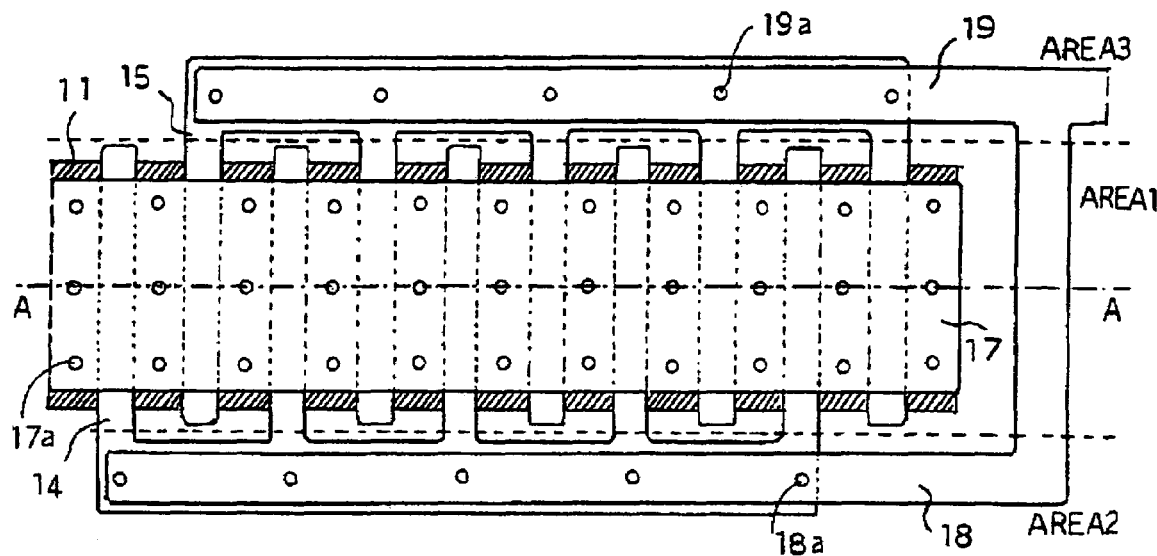
Figure 1B:
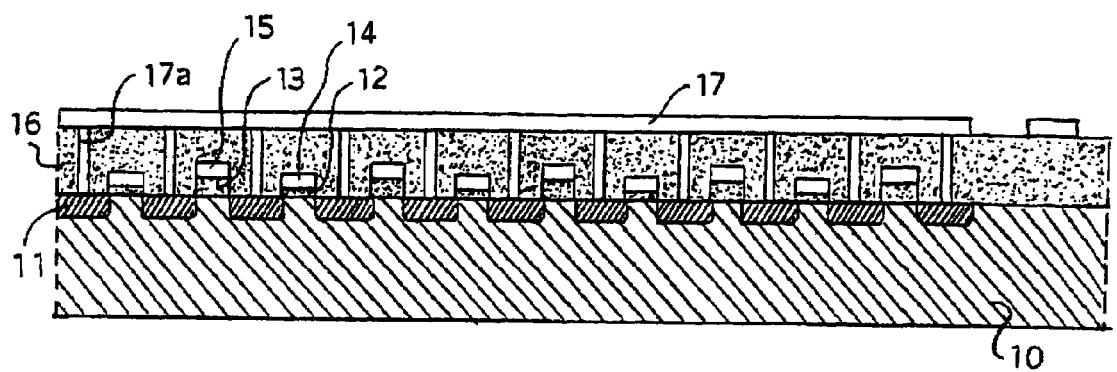

FIGS. 1(a) and 1(b) are views showing the variable capacitance diode according to an embodiment of the present invention, wherein FIG. 1(a) is a plan view thereof and FIG. 1(b) is a sectional view taken along line 1(b)—1(b) in FIG. 1(a). An interlayer insulating layer 16 is omitted in FIG. 1(a).

Figure 2:
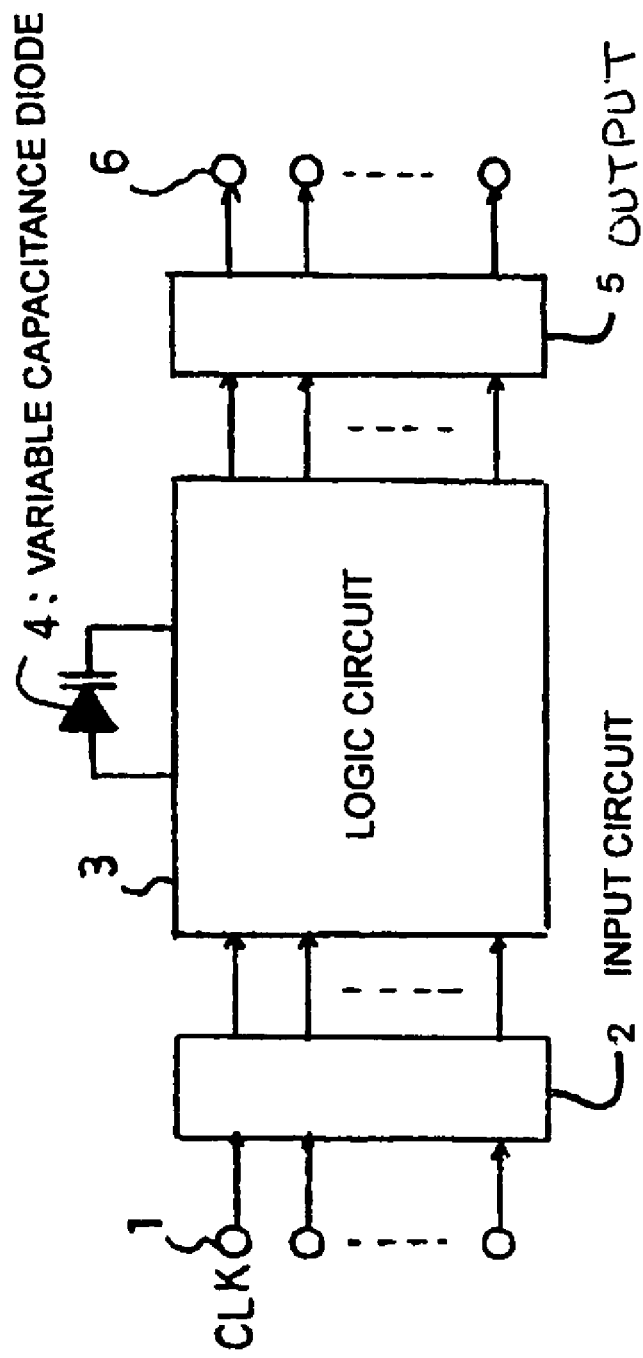
FIG. 2 is a schematic diagram showing a general configuration of a semiconductor device with a variable capacitance diode.

The variable capacitance diode is formed as a variable capacitance diode shown in FIG. 2. The variable capacitance diode has a first area AREA1 where diffusion areas 11 are formed on a surface (main surface) of a silicon substrate 10 in rectangle areas arranged in parallel through implanting n-type ions. A second area AREA2 (upper position in FIG. 1(a)) and a third area AREA3 (lower position in FIG. 1(a)) are formed on the surface of the silicon substrate 10 with the first area AREA1 in between.

A pair of gate oxide layers 12 and 13 with comb shapes is formed on the surface between the diffusion areas 11 with the rectangle shape. The gate oxide layers 12 and 13 face each other and are arranged to be nested inside one another, so that each tooth of the comb shape is arranged alternately. That is, the second oxide layer 12 has odd-numbered insulating layers, i.e., a first, a third, and so on, corresponding to teeth of the comb shape and arranged between the diffusion areas 11 alternately. The second oxide layer 13 has even-numbered insulating layers, i.e., a second, a fourth, and so on, corresponding to teeth of the comb shape and arranged between the odd-numbered insulating layers of the gate oxide layer 12.

The gate oxide layer 12 has a thickness of 2.5 nm same as that of a gate oxide layer of a transistor in a logic circuit 3. The gate oxide layer 13 has a thickness of 5.0 nm same as that of a gate oxide layer of transistors in an input circuit 2 and an output circuit 5.

A control electrode 14 formed of poly-silicone is formed on a surface of the gate oxide layer 12. That is, first, third, . . . electrodes are formed on the first, third, . . . insulating layers of the gate oxide layer 12, respectively. The first, third, . . . electrodes extend to the second area AREA2 and are connected to each other. A control electrode 15 (second, fourth, . . . electrodes) formed of poly-silicone is formed on a surface of the gate oxide layer 13. The second, fourth, . . . electrodes extend to the third area AREA3 and are connected to each other.

The interlayer insulating layer 16 covers the surface of the silicon substrate 10 with the diffusion area 11 and the control electrodes 14 and 15 formed thereon. Wiring patterns 17, 18, and 19 formed of a first metal such as aluminum are formed on a surface of the interlayer insulating layer 16. The wiring pattern 17 is formed on the diffusion areas 11 in the first area AREA1 and upper portions of the comb teeth of the gate oxide layers 12 and 13. The wiring pattern 17 is connected to the diffusion areas 11 through a plurality of contacts 17a penetrating the interlayer insulating layer 16.

As shown in the figure, the comb teeth of the control electrode 14 are connected to the wiring pattern 18 (first wiring layer) formed in the second area AREA 2 through a plurality of contacts 18A penetrating the interlayer insulating layer 16. The comb teeth of the control electrode 15 are connected to the wiring pattern 19 (second wiring layer) formed in the third area AREA 3 through a plurality of contacts 19A penetrating the interlayer insulating layer 16. The wiring patterns 18 and 19 are connected at, for example, a right side in the figure.

In the variable capacitance diode, a first, third, . . . capacitors are formed with the gate oxide layer 12 with a thickness of 2.5 nm and the comb teeth of the control electrode 14 between the silicon substrate 10. Second, fourth, . . . capacitors are formed with the gate oxide layer 13 with a thickness of 5.0 nm and the comb teeth of the control electrode 15. The control electrodes 14 and 15 of the capacitors are connected with each other through the wiring patterns 18 and 19 formed in the second area AREA 2 and the third area AREA 3, respectively. The plurality of the diffusion areas 11 on the silicon substrate 10 is connected to the wiring pattern 17 through the plurality of the contacts 17a. Accordingly, when a direct current voltage is applied to the control electrodes 14 and 15 (wiring patterns 18 and 19), the plurality of the capacitors connected in series between the wiring pattern 17 and the wiring patterns 18 and 19 functions as the variable capacitance diode in which a capacitance changes according to the applied voltage.

FIGS. 3(a) to 3(g) are views showing a process of producing the semiconductor device shown in FIGS. 1(a) and 1(b). A method of producing the variable capacitance diode will be explained next. The variable capacitance diode is produced together with MOS transistors in the input circuit 2, the logic circuit 3, and the output circuit 5 during a manufacturing process of the semiconductor integrated circuit shown in FIG. 2.

Figure 3A:
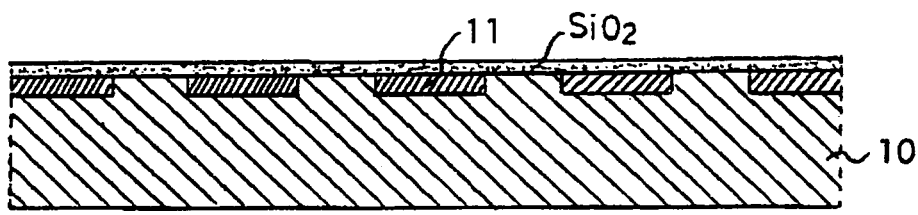
FIGS. 3(a) to 3(g) are views showing a process of producing the semiconductor device shown in FIGS. 1(a) and 1(b).
Figure 3B:
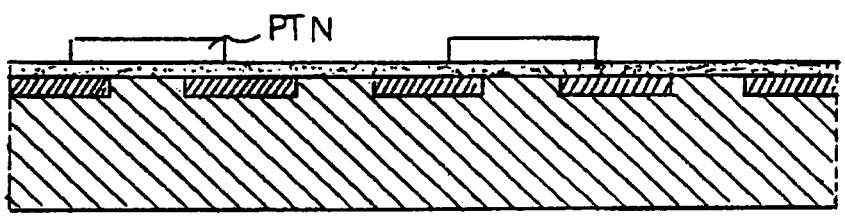
Figure 3C:
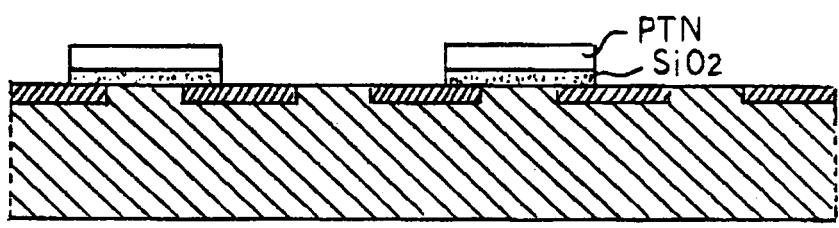

First, as shown in FIG. 3(a), n-type ions are implanted into the silicon substrate 10 to form the plurality of the diffusion areas 11. In the first oxide layer formation process, an oxide layer $SiO_2$ with a thickness of 4.5 nm is formed on an entire surface of the wafer. Then, as shown in FIG. 3(b), resist patterns PTN are formed in areas to be the input circuit 2 and the output circuit 5, and areas to be the gate oxide layers 13 with a thickness of 5.0 nm. The oxide layer is etched with the resist patterns PTN as a mask. As a result, as shown in FIG. 3(c), the oxide layer is completely removed in the un-masked areas, i.e., areas to be the logic circuit 3 and the gate oxide layer 12 with a thickness of 2.5 nm.

Figure 3D:
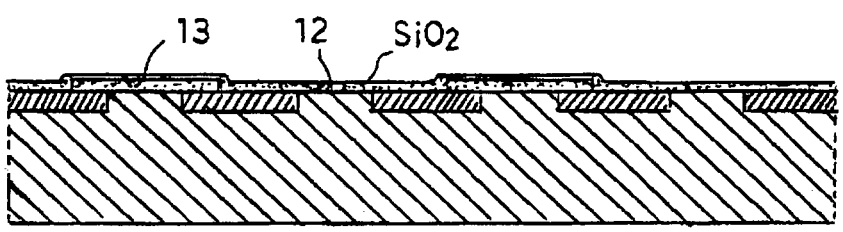

After the resist patterns are removed, the second oxide layer formation process is conducted on the entire surface of the wafer, so that the area without the oxide layer is covered with an oxide layer $SiO_2$ with a thickness of 2.5 nm. Accordingly, as shown in FIG. 3(d), the oxide layer with a thickness of 2.5 nm is formed on the area to be the logic circuit 3 and the area to be the gate oxide layer 12. The areas to be the input circuit 2 and the output circuit 5, and the area to be the gate oxide layer 13, where the oxide layer remains in the etching process, have a thickness of 4.5 nm when the second oxide layer formation process starts. Therefore, a growth rate of the oxide layer becomes small, and only an oxide layer of 0.5 nm is additionally deposited. As a result, the oxide layers of the input circuit 2 and the output circuit 4, and the gate oxide layer 13 have a thickness of 5.0 nm.

Figure 3E:
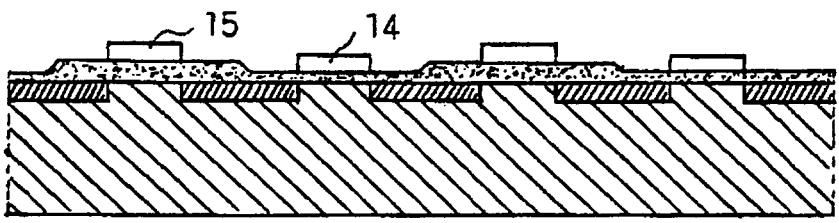
Figure 3F:
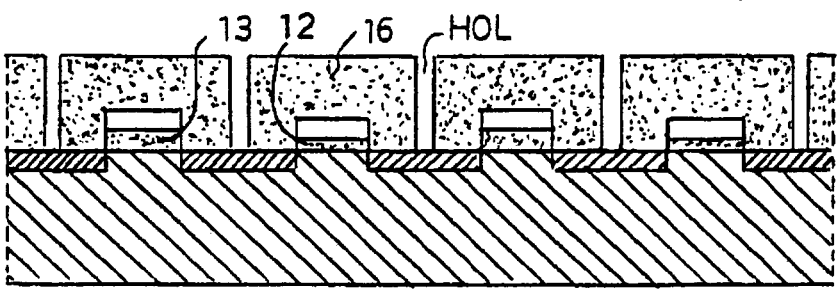
Figure 3G:
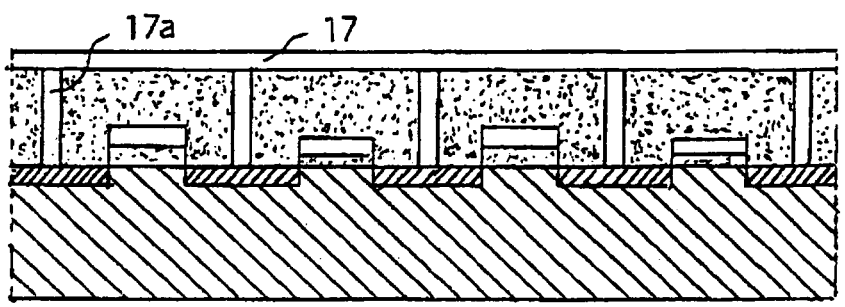

Then, as shown in FIG. 3(e), poly-silicon layers are formed and shaped to form the control electrodes 14 and 15. Further, as shown in FIG. 3(f), the interlayer insulating layer 16 is formed on the entire surface of the wafer. Contact holes HOL are formed in the interlayer insulating layer 16 for forming contacts 17a to 19a. A conductive material such as aluminum is filled in the contact holes HOL to form the contacts 17a to 19a. A first metal layer is formed on a surface of the interlayer insulating layer 16. Then, as shown in FIG. 3(g), the first metal layer is patterned to form the wiring patterns 17 to 19.

Accordingly, the variable capacitance diode shown in FIGS. 1(a) and 1(b) is produced. Although not shown in the figures, the transistors in the input circuit 2, the logic circuit 3, and the output circuit 5 are produced at the same time as the variable capacitance diode.

As described above, in the variable capacitance diode of the embodiment, the gate oxide layer has the thickness of 5.0 nm at a part of the area and the thickness of 2.5 nm at the remaining of the area. It is possible to freely change a ratio of the two areas through a shape of the resist mask used in the oxide layer etching process. That is, an average thickness of the gate oxide layer can be varied between 2.5 nm and 5.0 nm by changing a shape of the resist mask. When a dimension of the opposing electrodes and a dielectric constant of an insulating layer between the electrodes are constant, a static capacitance is in reverse proportion to a layer thickness. Accordingly, in the variable capacitance diode the embodiment, it is possible to change a variable range of the static capacitance without changing a shape of the electrodes.

Further, the comb teeth of the gate oxide layers 12 and 13 are arranged alternately with each other, and each of them is connected to the opposite side. Accordingly, when the base portion of the comb teeth is cut with a laser beam and the like to adjust the gate capacitance, it is possible to reduce a risk in which the adjacent gate oxide layer may be damaged.

With the variable capacitance diode of the present invention, it is possible to arbitrarily change an oscillating frequency of VCO during a manufacturing process without changing a shape of the electrodes.

In the present invention, in addition to the embodiments, various modifications are possible as follows:

(1) The diffusion area 11 may be formed through implanting p-type ions instead of n-type ions. In this case, a voltage applied to the control electrodes changes in a direction opposite to that of a change in the capacitance.

(2) Instead of the silicon substrate 10, a silicon-on-insulator (SOI) substrate or a silicon-on-sapphire may be used.

(3) The thickness of the gate oxide layers 12 and 13 are not limited to those in the embodiments.

(4) The structure in which the control electrodes with the different oxide layer thickness are nested inside one another is not limited to the variable capacitance diode, and may be applicable to a general capacitor.

The disclosure of Japanese Patent Application No. 2004-195484, filed on Jul. 1, 2004, is incorporated in the application.

While the invention has been explained with reference to the specific embodiments of the invention, the explanation is illustrative and the invention is limited only by the appended claims.

What is claimed is:

1. A semiconductor device, comprising:
   a semiconductor substrate having a first area, a second area disposed adjacent to the first area, and a third area disposed adjacent to the first area on a side opposite to the second area,
   a first capacitor having a first insulating layer with a first thickness formed in the first area and a first electrode formed on the first insulating layer, said first electrode extending from the first area to the second area,
   a second capacitor having a second insulating layer with a second thickness different from the first thickness formed in the first area and arranged in parallel to the first insulating layer with a first gap therebetween, and a second electrode formed on the second insulating layer, said second electrode extending from the first area to the third area,
   a third capacitor having a third insulating layer with the first thickness formed in the first area and arranged in parallel to the second insulating layer with a second gap therebetween, and a third electrode formed on the third insulating layer, said third electrode extending from the first area to the second area, a first wiring layer formed on the second area and electrically connected to the first electrode and the third electrode, and a second wiring layer formed on the third area and electrically connected to the second electrode.

2. A semiconductor device according to claim 1, further comprising a fourth capacitor having a fourth insulating layer with the second thickness formed in the first area and arranged in parallel to the third insulating layer with a third gap therebetween, and a third electrode formed on the third insulating layer, said fourth electrode extending from the first area to the third area, said second wiring layer electrically connected to the fourth electrode.

3. A semiconductor device according to claim 2, wherein said fourth capacitor includes a variable capacitance diode.

4. A semiconductor device according to claim 1, wherein each of said first, second, and third capacitors includes a variable capacitance diode.

5. A semiconductor device according to claim 1, wherein said semiconductor substrate includes one of a silicon substrate, a silicon-on-insulator substrate, and a silicon-on-sapphire substrate.

* * * * *